United States Patent [19]

Mihara et al.

[11] Patent Number: 4,928,159
[45] Date of Patent: May 22, 1990

[54] SEMICONDUCTOR DEVICE

[75] Inventors: Teruyoshi Mihara, Yokosuka; Tsutomu Matsushita, Yokohama, both of Japan

[73] Assignee: Nissan Motor Co., Ltd., Yokohama, Japan

[21] Appl. No.: 279,888

[22] Filed: Dec. 5, 1988

[30] Foreign Application Priority Data

Dec. 4, 1987 [JP] Japan .................... 62-305953

[51] Int. Cl.$^5$ ............................................. H01L 27/02
[52] U.S. Cl. ................................... 357/42; 357/23.4; 357/41; 357/46; 357/48; 357/13
[58] Field of Search ............... 357/23.4, 13, 42, 41, 357/46, 48

[56] References Cited

U.S. PATENT DOCUMENTS 4,798,974 1/1989 Reczek et al. ............... 357/42

OTHER PUBLICATIONS

Einzinger et al., "Analog Techniques", IEEE International Solid-State Circuits Conference, Feb. 1986, 22, 23 and 289.

Primary Examiner—Edward J. Wojciechowicz
Attorney, Agent, or Firm—Foley & Lardner, Schwartz, Jeffery, Schwaab, Mack, Blumenthal & Evans

[57] ABSTRACT

A single-chip integrated semiconductor device, in which a P-type isolation layer, to which the ground voltage is applied, is grown on a semiconductor substrate and a power voltage is applied to the substrate, in which a vertical MOSFET has a drain region of a first N-type well region formed in the P-type isolation layer so as to reach the semiconductor substrate therethrough, and is used in an output device for a load, in which a P-channel MOSFET is provided in the N-type well region formed in the P-type isolation layer, a constant voltage lower than the power voltage being applied to the N-type well region, and an N-channel MOSFET is formed in the P-type isolation layer, and in which the P-channel and N-channel MOSFETs constitute a CMOS circuit constructing a peripheral circuit for the vertical MOSFET.

5 Claims, 5 Drawing Sheets

SEMICONDUCTOR DEVICE

BACKGROUND OF THE INVENTION

1. Field of the Invention

The present invention relates to a semiconductor device and, more particularly, to a single-chip integrated semiconductor device including a vertical power MOSFET used such as a high-side switch and a CMOS circuit used such as a peripheral circuit therefor.

2. Description of the Background Art

Recently, a single-chip integrated semiconductor device (power IC) including a vertical power MOSFET (VDMOS) used as a switching device for a variety of power loads on an automobile, and CMOS peripheral circuits for the VDMOS, has been proposed. In such a power IC, a self-isolation technique having a relatively simple manufacturing process is advantageously employed for cost reduction, and thus the VDMOS is used as a high-side switch which drives the load in its source-follower circuits.

In FIG. 1, there is shown a conventional power IC for automotive use, as disclosed in IEEE International Solid-State Circuits Conference, 1986, p22. As shown in FIG. 1, in an N+-type semiconductor substrate 61, an N+-type epitaxial layer 62 is grown on its upper surface portion, and some elements or devices for constituting the power IC are formed in the upper surface area of the epitaxial layer 62, as follows.

In the N⁻-type epitaxial layer 62, a P-type channel region 63 is formed in the upper surface area, and a VDMOS 64 is formed in the channel region 63 while the epitaxial layer 62 is used as a substantial drain region. A power or battery voltage Vbat is applied to a drain electrode 65 attached to the rear surface of the N+-type substrate 61. Further, a low voltage P-channel MOSFET (LVPMOS) 66 with a low breakdown voltage and a high voltage P-channel MOSFET (HVPMOS) 67 with a high breakdown voltage are directly formed in the epitaxial layer 62. Two P-type well regions 68 and 69 are formed in the surface area of the epitaxial layer 62 by an impurity doping technique, and a low voltage N-channel MOSFET (LVNMOS) 71 with a low breakdown voltage and a high voltage N-channel MOSFET (HVNMOS) 72 with a high breakdown voltage are formed in the P-type well regions 68 and 69, respectively.

In the power IC shown in FIG. 1, by applying the battery voltage Vbat to the electrode 65, the N+-type substrate 61 and the N⁻-type epitaxial layer 62 are maintained to the maximum voltage in the device, and each PN junction between the N⁻-type epitaxial layer 62 and the P-type regions formed in the N⁻-type epitaxial layer 62 of each device is reverse-biased by the maximum voltage. Hence, the devices can be electrically isolated from one another, and be independently operated.

In FIG. 2, there is shown an equivalent circuit of the power IC of FIG. 1. A high voltage CMOS (HVCMOS) circuit 73 includes at least the HVPMOS 67 and the HVNMOS 72, and a low voltage CMOS (LVCMOS) circuit 74 includes at least the LVPMOS 66 and the LVNMOS 71. The LVCMOS circuit 74 may be operated by a voltage Vreg such as 5V fed from an electric power supply contained in the power IC, as hereinafter described in detail, and a load 75 is connected between the source electrode 76 of the VDMOS 64 and the ground GND.

In FIG. 3, there is shown a load driver using the power IC described above, including an electric power supply 77 for obtaining the voltage Vreg, a first protector 78 for preventing an overcurrent, an excessive temperature and the like, a second protector 79 for preventing an overvoltage and the like. The load driver further includes a charge pump (gate booster) 81 for preventing the increase of the power loss due to an on-resistance increase. That is, when no charge pump 81 is provided, the essential gatesource voltage is lowered by the source voltage increase of the VDMOS 64 during its conducting operation. In this case, the HVCMOS circuit 73 is used as a level shifter 80 to which a high voltage is applied, and the other logical circuits are comprised of the LVCMOS circuit 74.

The battery voltage Vbat is, for example, approximately 12 to 16V for the automobile, and the voltage Vreg to be applied to the LVCMOS circuit 74 is determined to, for instance, 5V by the power supply 77. Thus, the LVNMOS 71 is required a withstanding voltage higher than the determined voltage Vreg, and, since the LVPMOS 66 is directly formed in the N⁻-type epitaxial layer 62 to which the power voltage Vbat is applied, its withstanding voltage higher than the power voltage Vbat is required.

When the power IC is employed for the driver of the loads on the automobile, the power voltage Vbat may be varied from approximately 6V when cranking, to approximately 60V on an unusual operation such as a load dump. Hence, in the devices formed in the epitaxial layer 62 to which the power voltage Vbat is applied, a withstanding voltage of every PN junction formed between the N⁻-type epitaxial layer 62 and a P-type region of each device therein is determined to be greater than 60V.

Since the LVNMOS 71 is separated from the epitaxial layer 62 by the P-type well region 68, there is no need to make the LVNMOS 71 to a high voltage structure such as LDD. On the other hand, since the LVPMOS 66 is directly formed in the N⁻-type epitaxial layer 62, its isolation withstanding voltage is required to be determined greater than 60V even when its power source line is set to, for instance, 5V regulated by the power supply 77. In order to obtain such a high voltage isolation structure, it is necessary to supplementarily provide a lightly doped source (LDS) 83 and a lightly doped drain (LDD) 85 instead of a conventional highly doped single drain structure and approximately several μm of the diffusion depth XJ is required. Thus, in this case, it is difficult to miniaturize the devices, and the areas of the devices become large even when a channel length L of the MOSFET, as shown in FIG. 4, is reduced. Hence, in the power IC chip, as the LVCMOS circuit 74 occupying a large area, the chip size becomes large with a cost increase.

As shown in FIG. 2, in the LVCMOS circuit 74, the the substrate voltage of the LVPMOS 66 is Vbat, and its source voltage is Vreg fed from the power supply 77. Accordingly, a voltage difference Vbat-Vreg arises between the substrate and the source in the LVPMOS 66, and its gate threshold voltage Vth is raised by the substrate bias effect. In the automobile, since the variation of the power voltage Vbat is large, the gate threshold voltage vth in the LVPMOS 66 also varies correspondingly thereto, and thus the margin of the LVCMOS circuit 74 is narrowed.

SUMMARY OF THE INVENTION

Accordingly, it is a first object of the present invention to provide a single-chip integrated semiconductor device, free from the aforementioned defects and drawbacks of the prior art, which is capable of withstanding a high voltage without providing any particularly high voltage drain structure.

It is a second object of the present invention to provide a single-chip integrated semiconductor device which is capable of minimizing an area of its elements or devices so as to reduce its chip size.

It is a third object of the present invention to provide a single-chip integrated semiconductor device which is capable of obtaining a sufficient margin for the CMOS circuit without being affected by the substrate bias effect.

It is a fourth object of the present invention to provide a single-chip integrated semiconductor device which is capable of manufacturing without requiring any particular process.

This invention provides a semiconductor device, comprising a semiconductor substrate having a first conductivity type, to which a power voltage is applied, an isolation layer having a second conductivity type, grown on the semiconductor substrate, a ground voltage being applied to the isolation layer, a vertical MOSFET having a substantial drain region of a first well region having the first conductivity type, formed in the isolation layer to reach the semiconductor substrate therethrough and being used as output means for a load, a P-channel MOSFET formed in a second well region having the first conductivity type, which is formed in the isolation layer, a constant voltage lower than the power voltage being applied to the second well region, and an N-channel MOSFET formed in the isolation layer, the P-channel and N-channel MOSFETs constituting a CMOS circuit constructing a peripheral circuit for the vertical MOSFET.

DESCRIPTION OF THE PREFERRED EMBODIMENTS

Figure 1:
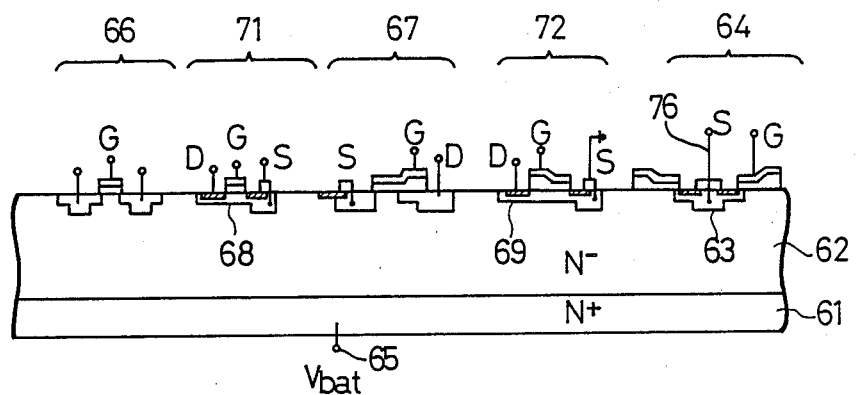
FIG. 1 is a longitudinal cross sectional view of a conventional semiconductor device.
Figure 2:
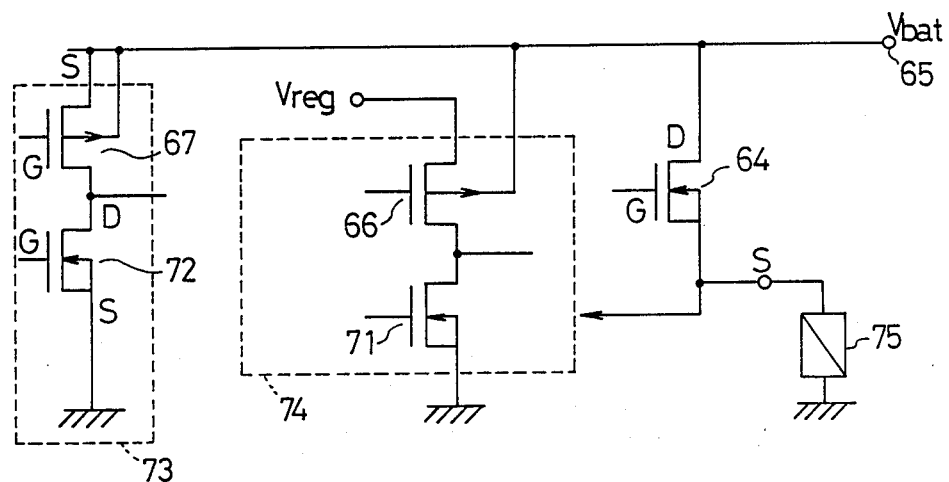
FIG. 2 is a circuit representation of an equivalent circuit of the semiconductor device of FIG. 1.
Figure 3:
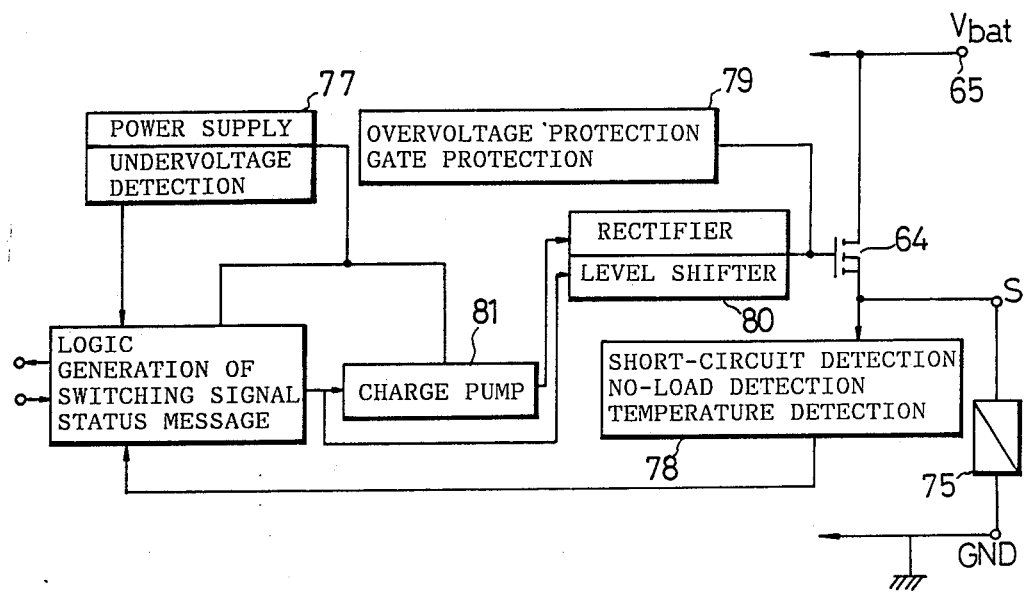
FIG. 3 is a block diagram of the semiconductor device of FIG. 1.
Figure 4:
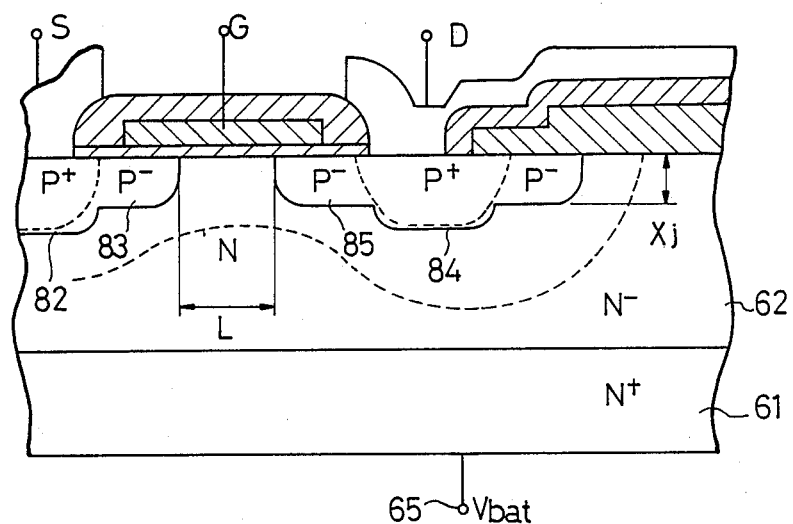
FIG. 4 is a cross sectional view of an LVPMOS having LDD and LDS structures shown in FIG. 1.
Figure 5:
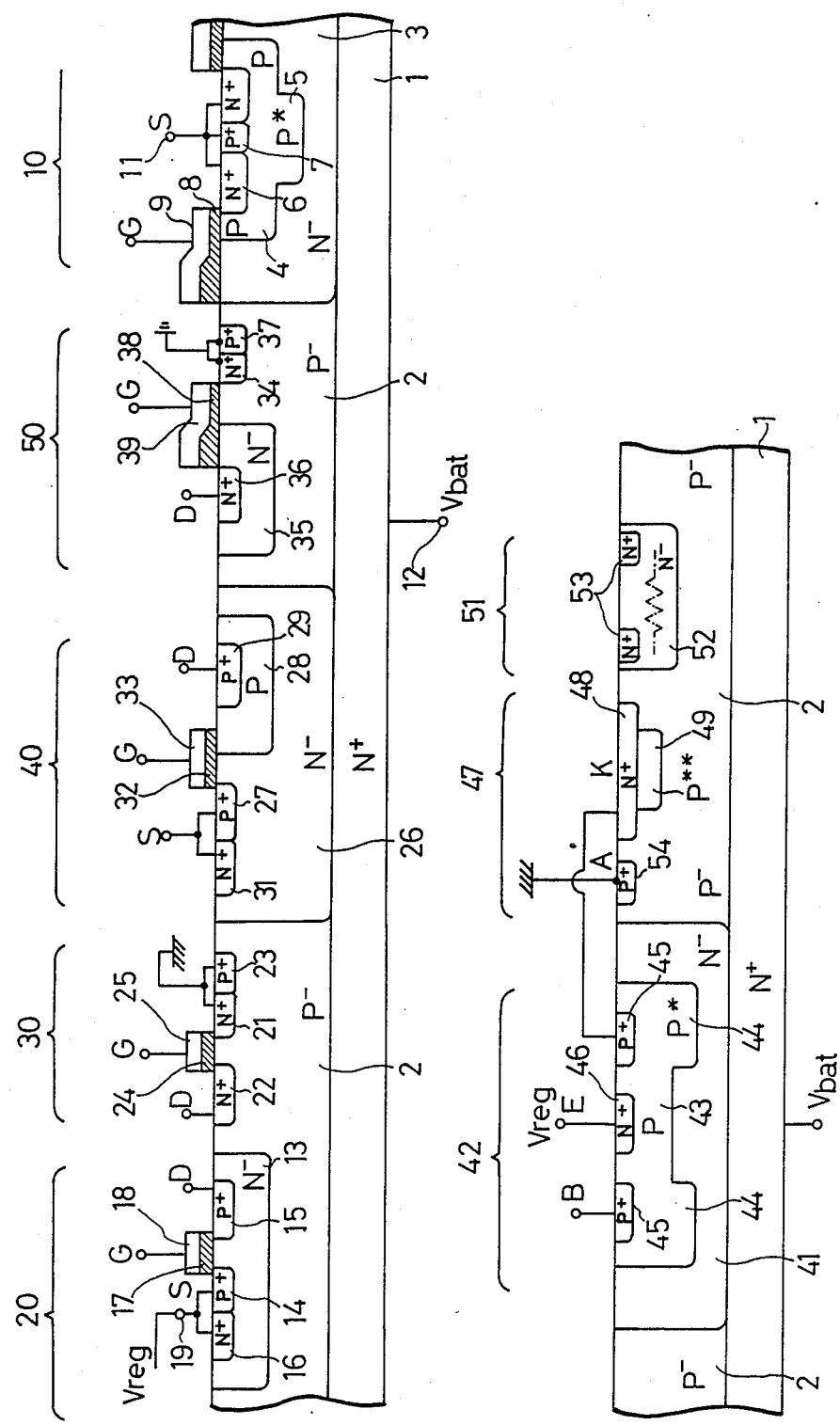
FIG. 5 is a longitudinal cross sectional view of a semiconductor device according to the present invention.

Referring now to the drawings, wherein like reference characters designate like or corresponding parts throughout the several views, there is shown in FIG. 5 one embodiment of a single-chip integrated semiconductor device according to the present invention.

As shown in FIG. 5, a $P^-$-type epitaxial isolation layer 2 is grown on the surface of an $N^+$-type semiconductor substrate 1 to obtain a $P^+$ on $N^+$ substrate. In this case, a plurality of elements and/or devices constituting a power IC according to the present invention are formed in the $P^-$-type isolation layer 2, as hereinafter described in detail.

A first $N^-$-type well region 3 is formed in the isolation layer 2 therethrough so as to reach the $N^+$-type substrate 1 for preparing a VDMOS 10 having a substantial drain region of the first well region 3. A P-type channel region 4 is formed in the surface area of the first well region 3 and is provided with a $P^+$-type plug region 5 in its central lower portion. In the P-type channel region 4, a pair of $N^+$-type source regions 6 and a $P^+$-type contact region 7 positioned therebetween in contact with the $N^+$-type source regions 6 are formed in the surface area of the P-type channel region 4. A gate electrode 9 for inducing a channel in the surface layer of the P-type channel region 4 is formed on the P-type channel region 4 via a gate oxide film 8 and extends over the $N^-$-type well region 3 and the $N^+$-type source region 6. A source electrode 11 is connected to the P-type channel region 4 through the $N^+$-type source region 6 and the $P^+$-type contact region 7, and a drain electrode 12 is attached to the rear surface of the $N^+$-type substrate 1. A power or battery voltage Vbat as a drain voltage is applied to the drain electrode 12.

An LVPMOS 20 and an LVNMOS 30 constituting a peripheral circuit LVCMOS 60 for the VDMOS 10 are formed in the $P^-$-type isolation layer 2 as follows. A second $N^-$-type well region 13 for the LVPMOS 20 is formed in the surface area of the isolation layer 2. A $P^+$-type source region 14 and a $P^+$-type drain region 15 are formed at a proper interval in the surface area portion of the second well region 13, and an $N^+$-type well contact region 16 is also formed in the surface area of the second well region 13 in contact with the source region 14 typically. A gate electrode 18 is formed on a gate oxide film 17 extending between the source and drain regions 14 and 15 over the second well region 13 therebetween, and a source electrode 19 is connected to the second well region 13 via the source region 14 and the well contact region 16. A constant voltage Vreg which is lower than the battery voltage Vbat fed from a power supply circuit hereinafter described, is applied to the source electrode 19.

In the $P^-$-type isolation layer 2, an $N^+$-type source region 21 and an $N^+$-type drain region 22 are formed at a certain distance away from each other in the surface area and a $P^+$-type isolation contact region 23 is also formed in contact with the source region 21 in the surface area of the isolation layer 2 in order to prepare the LVNMOS 30. A gate electrode 25 is formed on a gate oxide film 24 which is formed on the surface of the isolation layer 2 between the source and drain regions 21 and 22 and extends therebetween. The $P^-$-type isolation layer 2 is linked to the ground GND through the $P^+$-type isolation contact region 23, and the $N^+$-type source region 21 is also coupled to the GND.

A third $N^-$-type well region 26 is formed in the isolation layer 2 therethrough so as to reach the $N^+$-type substrate 1 for preparing an HVPMOS 40. A $P^+$-type source region 27 is formed in the surface area of the third well region 26, and a P-type region 28 is also formed away from the source region 27 in the surface area of the third well region 26 A $P^+$-type drain region 29 is formed in the surface area of the P-type region 28, and an $N^+$-type well contact region 31 is formed in contact with the source region 27 in the surface area of the third well region 26. A gate oxide film 32 is formed in the surface area of the third well region 26 between the source region 27 and the P-type region 28 and extends therebetween, and a gate electrode 33 is formed on the gate oxide film 32. In the drain portion, the P+-type drain region 29 and the P-type region 28 surrounding the drain region 29 constitute a graded drain (GDD) of a high voltage withstanding structure.

In the P−-type isolation layer 2, an N+-type source region 34 and an N−-type region 35 apart therefrom are formed in the surface area, and an N+-type drain region 36 is formed in the surface area of the N−-type region 35 in order to produce an HVNMOS 50. A P+-type isolation contact region 37 is formed in contact with the source region 34 in the surface area of the P−-type isolation layer 2. A gate electrode 39 is formed on a gate oxide film 38 which is formed on the surface area of the P−-type isolation layer 2 between the source region 34 and the N−-type region 35 and extends therebetween. In the drain portion, the N+-type drain region 36 and the N−-type region 35 surrounding the drain region 36 constitute the GDD of the highly withstanding voltage structure. The P−-type isolation layer 2 is connected to the GND via the P+-type isolation contact region 37, and the N+-type source region 34 is also linked to the GND.

A fourth N−-type well region 41 is formed in the isolation layer 2 therethrough so as to reach the N+-type substrate 1 for preparing an NPN bipolar transistor 42 having a collector region of the fourth well region 41. A P-type base region 43 is formed in the surface area of the fourth well region 41 and is provided with a pair of deep P+-type well regions 44 in the left and right side bottom portions in order to improve the withstanding voltage between the collector and the base, resulting in the NPN bipolar transistor 42 having a highly withstanding voltage structure. In the surface area of the P-type base region 43, a pair of P+-type base contact regions 45 and an N+-type emitter region 46 placed therebetween separate from the P+-type base contact regions 45 are provided. The constant voltage Vreg output from the emitter region 46 is fed to the peripheral circuit LVCMOS 60.

In the P−-type isolation layer 2, in order to form a Zener diode 47 providing a reference voltage to the power supply circuit hereinafter described, an N+-type diffusion layer 48 is formed in the surface area, and a highly doped P++-type diffusion layer 49 for controlling a Zener voltage is formed in contact with the bottom surface of the N+-type diffusion layer 48. That is, in this embodiment, for the stability of the Zener voltage, the Zener junction between the N+-type diffusion layer 48 and the P++-type diffusion layer 49 is provided in the bulk side of the P−-type isolation layer 2. Although a surface Zener junction can be prepared by using a P+-type diffusion layer and an N+-type diffusion layer for use in producing another element, however, in such a surface Zener junction, the "walkout" phenomenon may be caused in a long period of stability by injecting hot electrons into a silicon oxide film interface in the surface. A P+-type contact region 54 connected to the GND is provided apart from the N+-type diffusion layer 48 in the surface portion of the isolation layer 2. The N+-type diffusion layer 48 as the cathode is connected to one of the P+-type base contact regions 45 of the NPN bipolar transistor 42 through a wiring.

In the P−-type isolation layer 2, an N−-type well region 52 for constituting a resistor 51 for the power supply circuit is formed in the surface area, and a pair of N+-type contact regions 53 are formed in the left and right side end surface portions of the well region 52.

Figure 7:
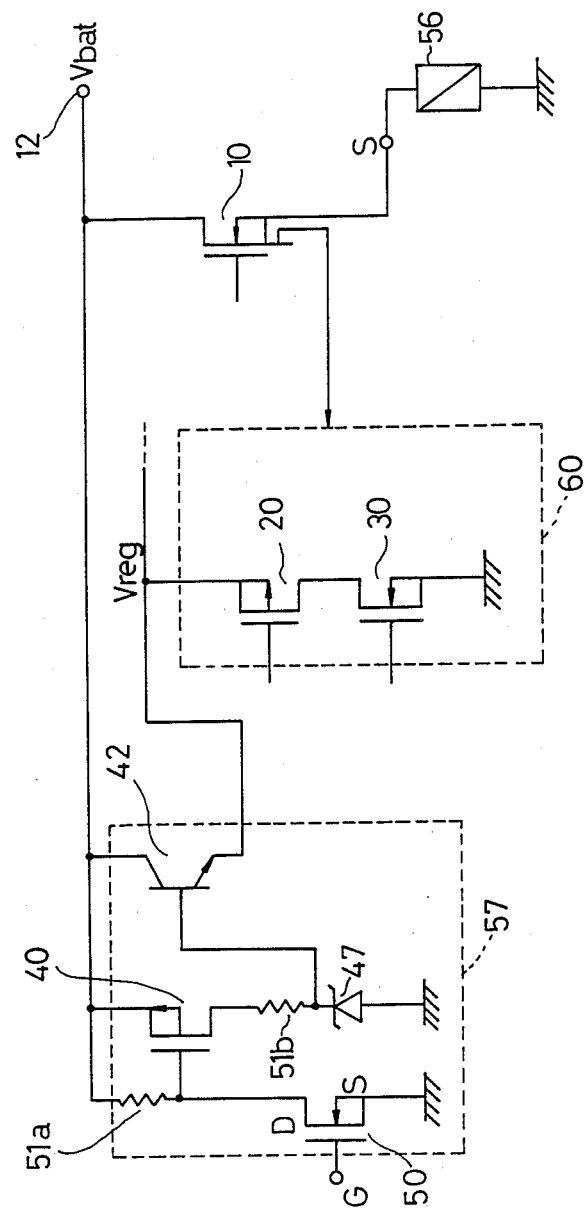
FIG. 7 is a circuit representation of an equivalent circuit of the semiconductor device of FIG. 5.

As described above, the power voltage Vbat is applied to the source of the HVPMOS 40 and to the collector of the NPN bipolar transistor 42, which are formed in the respective third and fourth N−-type well regions 26 and 41, through the N+-type substrate 1 in order to regulate the voltage Vbat to the voltage Vreg, as shown in FIG. 7.

Then, one embodiment of a manufacturing process of the essential parts of the semiconductor device described above according to the present invention will be described in detail in connection with FIG. 6.

Figure 6A:
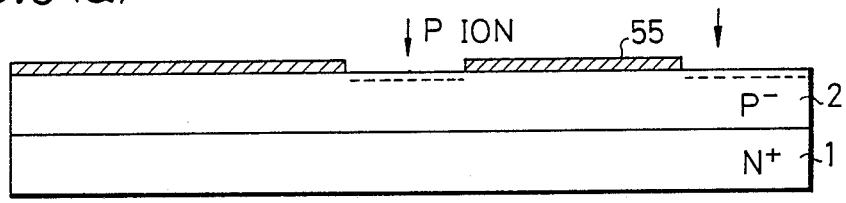
FIGS. 6(a) through 6(e) are longitudinal cross sectional views, showing a fabricating process of the semiconductor device of FIG. 5.

In FIG. 6a, the P−-type epitaxial isolation layer 2 is grown on the surface of the N+-type semiconductor substrate 1 to prepare the P−-on-N+ substrate, and a silicon dioxide film 55 is formed on the surface of the isolation layer 2. After photoetching of the silicon dioxide film 55 by using the silicon dioxide film 55 as a mask, phosphor (P) ion is doped into the isolation layer 2 in order to form the first, third and fourth N−-type well regions 3, 26 and 41.

Figure 6B:
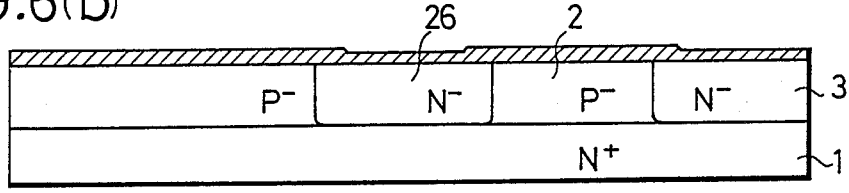

In FIG. 6b, the diffusion is performed by annealing to make the first, third and fourth N−-type well regions 3, 26 and 41 to reach the N+-type substrate 1. In this step, the first N−-type well region 3 to become the substantial drain region of the VDMOS 10, the third N−-type well region 26 of the HVPMOS 40 and the fourth N−-type well region 41 to become the collector region of the NPN bipolar transistor 41 are formed at the same time.

Figure 6C:
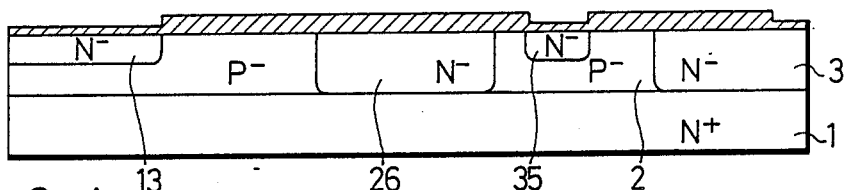

In FIG. 6c, the ion dopings are conducted and the doped ions are diffused by annealing to form the second N−-type well region 13 of the LVPMOS 20, the N−-type region 35 for the GDD of the HVNMOS 50 and the N−-type well region 52 of the resistor 51 as well as the P+-type channel region 5 of the VDMOS 10 and the P+-type well regions 44 of the NPN bipolar transistor 42 at the same time.

Figure 6D:
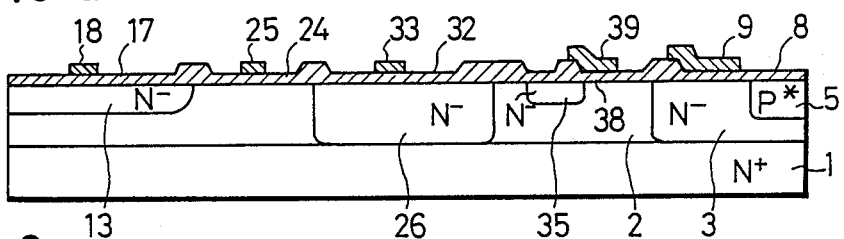

In FIG. 6d, for the MOSFETs 10, 20, 30, 40 and 50, a silicon dioxide film is grown on the surface of the substrate in the desired thickness by the thermal oxidation, and a polycrystalline silicon layer is formed on the silicon dioxide film. Then, the photoetching of the polycrystalline silicon layer is carried out to obtain the gate electrodes 9, 18, 25, 33 and 39.

Figure 6E:
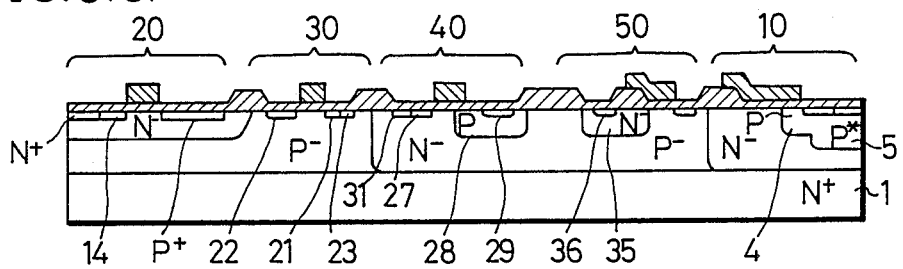

In FIG. 6e, the ion dopings and the diffusion by annealing are conducted in almost the same manner as the steps in FIGS. 6a and 6b to form the P-type channel region 4 of the VDMOS 10, the P-type region 28 for the GDD of the HVPMOS 40, the P-type base regions 43 of the NPN bipolar transistor 42, and the P++-type diffusion layer 49 of the Zener diode 47 at the same time.

Lastly, the ion dopings and the diffusion are performed in order to form the P+-type and/or N+-type source, drain, emitter and contact regions of the MOSFETs, the bipolar transistor and the resistor. Then, contact openings for the electrodes or terminals are made in the desired positions of the elements, and the wiring of the electrodes or terminals are prepared by a metal film of aluminum, thereby obtaining the semiconductor device according to the present invention.

As described above, in the semiconductor device structure of the present invention, although the step for forming the first, third and fourth N−-type deep well regions 3, 26 and 41 is supplemented as compared with the conventional semiconductor device shown in FIGS. 1 to 4, the diffusion step for forming the shallow LDD in the conventional HVNMOS or the like can be replaced with the N⁻-type region 35 or the like of the GDD structure, and the step for forming the N⁻-type region 35 can be processed at the same time as the step for forming the second N⁻-type well region 13 of the LVPMOS 20 without requiring a particular step. Hence, the total number of the steps of the present process is almost the same as that of the conventional process.

In FIG. 7, there is shown an equivalent circuit of the power IC shown in FIG. 5, which functions as a driver for a load 56 connected between the source electrode 11 of the VDMOS 10 and the GND, and the VDMOS 10 is used as an output device for the load such as a high-side switch for driving the load 56 in its source follower.

A power supply circuit 57 for generating the constant voltage Vreg comprises the HVNMOS 50, the HVPMOS 40, the Zener diode 47, the NPN bipolar transistor 42 and two resistors 51a and 51b. For the brevity, the two resistors 51a and 51b in FIG. 7 are represented by the resistor 51 in FIG. 5. The power supply circuit 57 is driven by inputting a high (H) level signal to the gate electrode 39 of the HVNMOS 50, and outputs the constant voltage Vreg represented in the following equation:

$$Vreg = Vz - Vbe \quad (1)$$

wherein Vz is a Zener voltage of the Zener diode 47 and Vbe is a forward voltage drop between the base and emitter of the NPN bipolar transistor 42. The constant voltage Vreg is applied to a power terminal of the LVCMOS circuits 60 including a large number of the LVPMOS 20 and the LVNMOS 30.

An operation of the power IC described above will now be described.

Now, the VDMOS 10 is supposedly used as a high-side switch of a power load 56 for an automobile. Usually, the power voltage Vbat for the automobile is approximately 12 to 16V, and, when the Zener voltage Vz of the Zener diode 47 is determined so that the constant voltage Vreg output from the power supply circuit 57 may be, for example, 5V, 5V of the voltage Vreg is applied to the power terminal of the LVCMOS circuit 60. By setting such an applied voltage Vreg, the VDMOS 10 is controlled by the peripheral circuit including the LVCMOS circuit 60 and the like, and VDMOS 10 acts as the high-side switch to drive the load 54.

In turn, in an unusual operation, the power voltage Vbat may become an overvoltage of approximately 50V by, e.g., the load dump surge or the like. However, in this embodiment, the HVPMOS 40 and the HVNMOS 50 include the GDDs of the high voltage withstanding structure, and the NPN bipolar transistor 42 is provided with the P⁺-type deep well regions 44 of the high voltage withstanding structure around the base region 43. Further, the LVCMOS circuit 60 is driven by the constant voltage Vreg fed from the power supply circuit 57, and the LVPMOS 20 and the LVNMOS 30 constituting the LVCMOS circuit 60 are shielded from the power voltage Vbat by the P⁻-type isolation layer 2. Therefore, the MOSFET elements or devices and the bipolar transistors can be properly and effectively protected from the breakdown due to the overvoltage.

Accordingly, in an unusual occasion such as an application where an overvoltage is generated in the power voltage Vbat due to the load dump surge, the LVCMOS circuit 60 is not required to have an excessively high voltage withstanding structure, and its component elements having a single drain and a single source structure can be sufficiently used. Hence, the element area can be reduced, and the area of the LVCMOS circuit 60 occupying the relatively large area in the power IC chip can be diminished, thereby largely reducing the chip size.

Further, since the LVPMOS 20 of the LVCMOS circuit 60 is formed in the second N⁻-type well region 13 to which the low constant voltage Vreg lower than the power voltage Vbat is applied and the second N⁻-type well region 13 and the P⁺-type source region 14 are of the same voltage by the constant voltage Vreg, the rise of the gate threshold voltage Vth due to the substrate bias effect can not be caused. Further, since the gate threshold voltage Vth is not affected by the variation of the power voltage Vbat, the margin in designing a circuit using the LVCMOS circuit 60 can be sufficiently ensured.

In this embodiment of the present invention, as described above, the chip size can be designed to be miniaturized, and the isolation of the elements or devices can be effectively achieved. Therefore, there is no need to add a particular manufacturing process and to alter the manufacturing process, and thus the semiconductor device of the present invention can be produced in a normal or standard IC manufacturing process with a cost reduction.

What is claimed is:
1. A semiconductor device, comprising:
a semiconductor substrate having a first conductivity type, to which a power voltage is applied;
an isolation layer having a second conductivity type, grown on the semiconductor substrate, a ground voltage being applied to the isolation layer;
a vertical MOSFET having a substantial drain region of a first well region having the first conductivity type, formed in the isolation layer to reach the semiconductor substrate therethrough and being used as output means for a load;
a P-channel MOSFET formed in a second well region having the first conductivity type, which is formed in the isolation layer, a constant voltage lower than the power voltage being applied to the second well region; and
an N-channel MOSFET formed in the isolation layer, the P-channel and N-channel MOSFETs constituting a CMOS circuit constructing a peripheral circuit for the vertical MOSFET.

2. The device of claim 1, also including power supply circuit means for generating the constant voltage.

3. The device of claim 2, wherein the power supply circuit means including:
a second P-channel MOSFET having a high voltage withstanding structure, formed in a third well region having the first conductivity type, which is formed in the isolation layer to reach the semiconductor substrate therethrough;
a second N-channel MOSFET having a high voltage withstanding structure, formed in the isolation layer;
a bipolar transistor having a well region having the second conductivity type, formed in a fourth well region having the first conductivity type, which is formed in the isolation layer to reach the semiconductor substrate therethrough; and a Zener diode having a diffusion layer having the second conductivity type for controlling a Zener voltage, formed in the isolation layer.

4. The device of claim 1, wherein the vertical MOSFET is used as a high-side switch.

5. The device of claim 3, wherein the constant voltage is determined depending on the Zener voltage of the Zener diode.

* * * * *